United States Patent
Lester

[11] Patent Number: 6,091,085
[45] Date of Patent: Jul. 18, 2000

[54] GAN LEDS WITH IMPROVED OUTPUT COUPLING EFFICIENCY

[75] Inventor: Steven D. Lester, Palo Alto, Calif.

[73] Assignee: Agilent Technologies, Inc., Palo Alto, Calif.

[21] Appl. No.: 09/026,465

[22] Filed: Feb. 19, 1998

[51] Int. Cl.[7] .................................................. H01L 33/00
[52] U.S. Cl. .............................. 257/98; 257/95; 257/103
[58] Field of Search .................................. 257/79, 91, 95, 257/98, 103

[56] References Cited

U.S. PATENT DOCUMENTS

| 5,373,174 | 12/1994 | Yamamoto | 257/98 |
| 5,491,350 | 2/1996 | Unno et al. | 257/95 |
| 5,814,839 | 9/1998 | Hosoba | 257/98 |
| 5,912,477 | 6/1999 | Negley | 257/95 |

OTHER PUBLICATIONS

D. Kapoinek et al., "Anisotropic Epitaxial Lateral Growth in GaN Selective Area Epitaxy", Applied Physics Letters, vol. 71, No. 9, Sep. 1, 1997, pp. 1204–1206.

Primary Examiner—Minh Loan Tran

[57] ABSTRACT

An LED having a higher light coupling efficiency than prior art devices, particularly those based on GaN. An LED according to the present invention includes a substrate having a top surface, a first layer of a semiconducting material deposited on the top surface of the substrate, a light generation region deposited on the first layer, and a second layer of semiconducting material deposited on the first layer. Electrical contacts are connected to the first and second layers. In one embodiment, the top surface of the substrate includes protrusions and/or depressions for scattering light generated by the light generation region. In a second embodiment, the surface of the second layer that is not in contact with the first layer includes a plurality of protrusions having facets positioned such that at least a portion of the light generated by light generation layer strikes the facets and exits the surface of the second layer. In a third embodiment, the second layer includes a plurality of channels extending from the surface of the second layer that is not in contact with the light generation layer. The channels are filled with a material having an index of refraction less that that of the semiconducting material.

8 Claims, 4 Drawing Sheets

GAN LEDS WITH IMPROVED OUTPUT COUPLING EFFICIENCY

FIELD OF THE INVENTION

The present invention relates to light emitting diodes (LEDs), and more particularly, to an improved GaN-based LED.

BACKGROUND OF THE INVENTION

LEDs are typically constructed by growing a p-n diode on a substrate. The diode is constructed by growing a layer of n-doped material on the substrate, growing a light generation region on the n-doped layer, and then growing the layer of p-doped material on top of the n-doped material. An electrode is then deposited on the top surface of the p-doped layer, and a contact is made to the n-doped layer. Light may be extracted either through the substrate or through the electrode on top of the p-doped material. If the light is to be removed through the top electrode, the electrode is constructed from a transparent material such as indium tin oxide or thin gold.

The efficiency of an LED is the product of two efficiencies, the efficiency with which power applied to the electrodes is converted to light and the efficiency with which that light is coupled out of the device. For GaN-based LEDs fabricated on sapphire substrates, a large fraction of the light generated in the diode is lost because of poor coupling efficiency. GaN has an index of refraction that is much higher than that of air or epoxy encapsulants. Accordingly, only light impinging on the surface of the diode in a small cone of angles will escape the surface. Most of the remaining light is reflected back into the GaN layer and is trapped in a waveguide bounded by the sapphire substrate surface and the GaN top surface. Much of this trapped light is eventually absorbed within the device. Accordingly, the efficiency of GaN diodes is less than ideal.

One method that has been suggested for improving the extraction efficiency of an LED requires the LED to be macroscopically shaped such that light generated in the device strikes the surface at the critical angle or greater, thereby preventing the internal reflection problem described above. In these LEDs, the chip is shaped as a hemisphere or truncated pyramid. Such shaping of the chip is very cumbersome and quite costly.

A second prior art method for improving the extraction efficiency of a GaAs-based LED utilizes a roughening of the upper surface or side surfaces of the LED by etching to destroy the planar nature of the surface thereby providing a large variety of non-planar facets through which light striking the surface can exit. The prior methods for roughening the surface involve a random etching of the top surface of the LED. For example, an irregular etch pattern can be generated by depositing particles on the surface of the LED and then using the particles to define a random etch mask. The resulting pattern has at least two problems. First, the pattern can leave islands in the top electrode. These islands are not connected to the top electrode contact through which the power connection to the electrode is made. Hence, the portion of the LED under these islands does not generate light. As a result the effective area of the LED, and hence the total light generated, is reduced.

Second, in GaN-based LEDs, the p-n junction, which contains the light generation region is very close to the upper surface. Hence, the etching often destroys a substantial portion of the junction. The destroyed portions do not generate light. This leads to a further reduction in the effective light generation area.

Broadly, it is the object of the present invention to provide an improved LED.

It is a further object of the present invention to provide an LED with improved coupling efficiency.

These and other objects of the present invention will become apparent to those skilled in the art from the following detailed description of the invention and the accompanying drawings.

SUMMARY OF THE INVENTION

The present invention is an LED having a higher light coupling efficiency than prior art devices, particularly those based on GaN. An LED according to the present invention includes a substrate having a top surface, a first layer of a semiconducting material deposited on the top surface of the substrate, a light generation layer, and a second layer of the semiconducting material deposited on the light generation layer. Electrical contacts are connected to the first and second layers. The first and second layers form a p-n diode. In one embodiment of the invention, the top surface of the substrate includes protrusions and/or depressions for scattering light generated in the light generation region. In a second embodiment of the invention, the surface of the second layer that is not in contact with the first layer includes a plurality of protrusions having facets positioned such that a portion of the light generated by the light generation region strikes the facets and exits the LED. If light is taken out through the sapphire, the protrusions serve to scatter light back into the sapphire. In a third embodiment of the invention, the second layer comprises a plurality of channels or depressions extending from the surface of the second layer that is not in contact with the light generation region. The channels or depressions are filled with a material having an index of refraction less that that of the semiconducting material. The depressions can be formed by altering the growth conditions of the second layer.

DETAILED DESCRIPTION OF THE INVENTION

Figure 1:
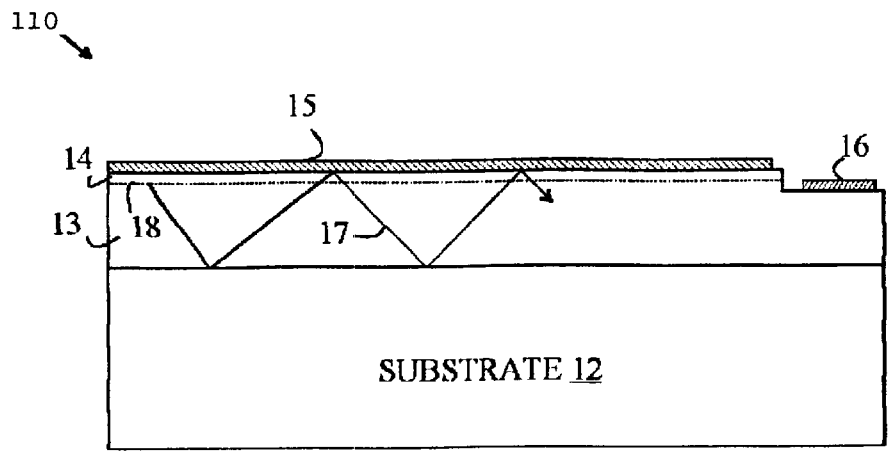
FIG. 1 is a cross-sectional view of a GaN-based LED.

The manner in which the present invention achieves its advantages may be more easily understood with reference to FIG. 1, which is a simplified cross-sectional view of a GaN-based LED. LED 10 is constructed on a sapphire substrate 12 by growing two layers of GaN epitaxially on the substrate. The first layer 13 is doped to be n-type, and the second layer 14 is doped to be p-type. A light generation region 18 is sandwiched between these two layers. In general the light generation region consists of a number of layers which include a light generation layer in which holes and electrons recombine to generate light, and cladding layers on each side of this layer. Light is generated in the light generation layer by the recombination of holes and electrons that are injected from the p-n diode layers. Since, the details of these layers are well known to those skilled in the art, and these details are not pertinent to the manner in which the present invention achieves its advantages, these layers are shown as a single line in the Figures. To simplify the following discussion, the light generation region will be referred to as the p-n junction region.

A transparent electrode 15 is deposited on the surface of the p-type layer. A second electrode is deposited 16 on a portion of the GaN layer that has been etched back to layer 13 to provide the n-contact.

As noted above, a substantial fraction of the light generated at the light generation region is trapped within the GaN layers because of the high index of refraction of the GaN. The high index of refraction leads to a small critical angle. Light striking the surface at angles greater than the critical angle is totally reflected by the GaN surface. This light bounces back and forth between electrode 15 and the surface of the sapphire/GaN layer as shown at 17. Much of this light is eventually absorbed, and hence, does not provide a useful output.

The present invention improves the coupling efficiency of a GaN-based LED by disrupting the waveguide described above. The waveguide may be disrupted by altering the surface of the interface between the sapphire/GaN layer and/or the surface of the GaN layer.

The present invention utilizes four methods, either separately or in combination, to disrupt the waveguide effect. The first method involves roughening the sapphire/GaN interface. This method is based on the surprising result that the sapphire surface may be roughened prior to the GaN epitaxial growth without interfering with the epitaxial growth of the GaN or the light generation efficiency of the p-n diode. It should be noted that this method is not applicable to devices based on GaAs, as these devices require a highly polished substrate to support the growth of the GaAs layers.

Figure 2:
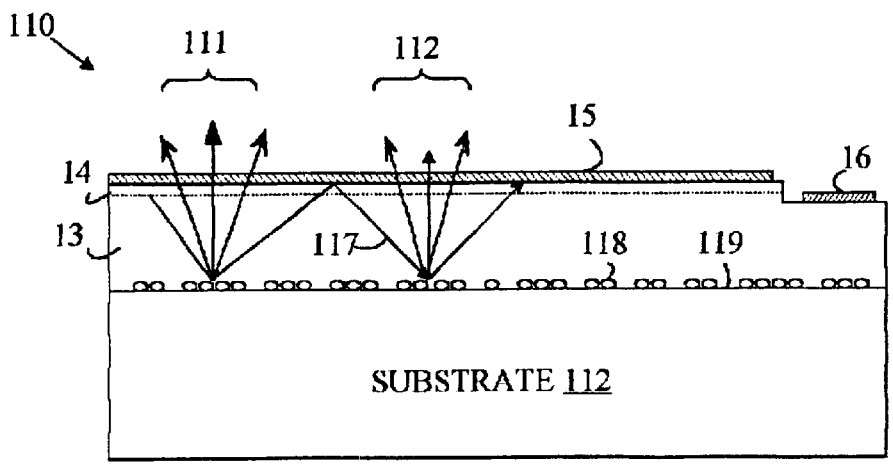
FIG. 2 is a cross-sectional view of an LED according to one embodiment of the present invention.

Refer now to FIG. 2, which is a cross-sectional view of a GaN-based LED 110. Those elements shown in FIG. 2 that perform the same function as elements shown in FIG. 1 have been given the same labels, and will not be discussed further. The roughening leads to features 118 and 119 that scatter the light striking the interface, thereby reflecting a portion of the light at angles less than the critical angle of the GaN/electrode/air or epoxy interface. The light that is scattered into a cone that is within the critical angle of the top surface escapes the LED through the top surface as shown at 111. Light 117 that is scattered at a shallow angle is reflected from the top surface of the GaN layer and once again strikes the substrate interface. A portion of this light will be scattered at angles that allow it to escape the top surface of the LED as shown at 1 12. The light which is scattered at too shallow an angle will once again bounce off of the top surface the process will be repeated.

The scattering features in the sapphire surface may be depressions 119 or protrusions 118 and are preferably greater than, or of the order of, the wavelength in the GaN of the light generated by the LED. If the features are much less than the wavelength of the light, the light will not be effectively scattered. If the features are a significant fraction of the GaN layer thickness, the roughening can result in imperfections in the top surface of the GaN. Within these limits, the roughening provides a significant improvement in the light coupling efficiency without altering the surface features of the LED.

The roughening can be accomplished by any of a number of techniques. For example, the surface may be mechanically roughened by polishing it with relatively coarse grinding grit. For example, the sapphire wafer can be mounted on a metal puck affixed over a grinding wheel. Diamond polishing grit is then used to "scratch" the sapphire to the desired roughness. Diamond grit sizes ranging from 3 to 15 microns have been found to be satisfactory.

It should be noted that sapphire substrates are normally polished to a high degree after cutting, and prior to use for LED substrates. Hence, the roughening can be accomplished by omitting the final polishing steps in the conventional substrate manufacturing process. In this case, the present invention actually reduces the cost of manufacturing the substrates while improving the overall efficiency of the LEDs.

The alterations in the reflectivity of the sapphire surface may also be accomplished by etching the surface to roughen it. The random etching process discussed above with respect to etching the upper surface of the LED may be utilized on the sapphire substrate without the deleterious effects described above, since a roughening of the sapphire substrate does not lead to interruptions in the p-n junction or islands in the upper electrode. The etching can be carried out by lithographically defining openings using photoresist and then using the photoresist as an etch mask. The etching can be performed by any of a number of conventional methods such as ion etching, ion milling, or $H_3PO_4$.

Roughening the substrate surface is also found to be effective in geometries in which the light exits through the substrate. In such geometries, the top electrode is constructed from a reflective material so that light striking the top electrode is reflected back toward the substrate.

The second method for disrupting the waveguide utilizes a controlled disruption of the upper surface of the GaN layer to provide a variety of facets through which the light generated in the active region, or reflected from the substrate interface, can exit. As noted above, the resultant disruption should not lead to a substantial decrease in the area of the active layer that generates light. Accordingly, any disruption pattern should not generate "islands" in the top electrode, the upper layer of the p-n junction, or disrupt a significant portion of the active layer junction.

Figure 3:
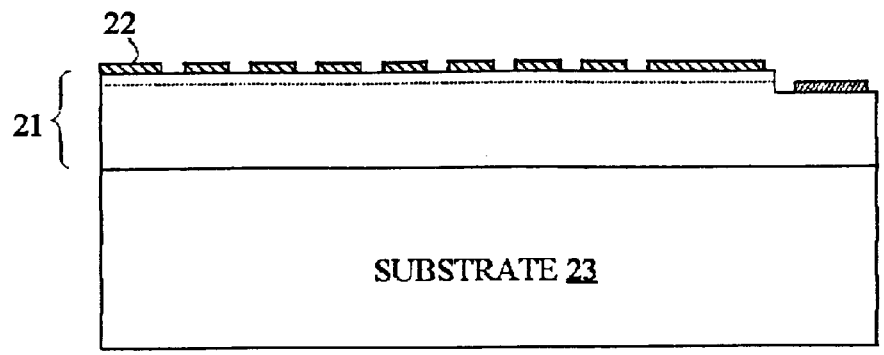
FIGS. 3–6 are cross-sectional views of another embodiment of an LED according to the present invention at various stages in the fabrication process.
Figure 4:
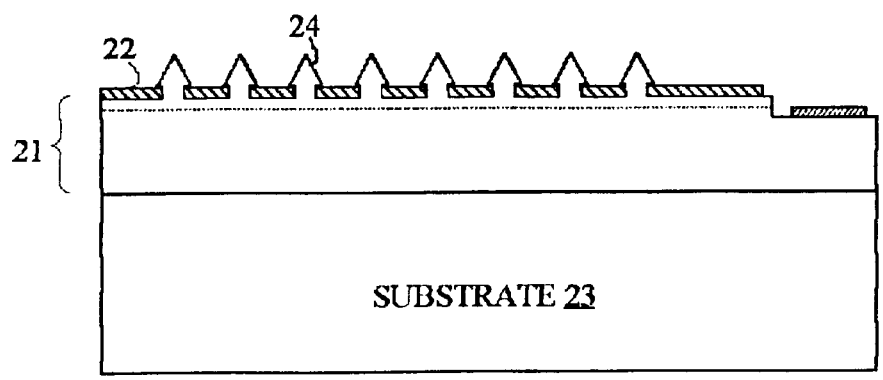
Figure 5:
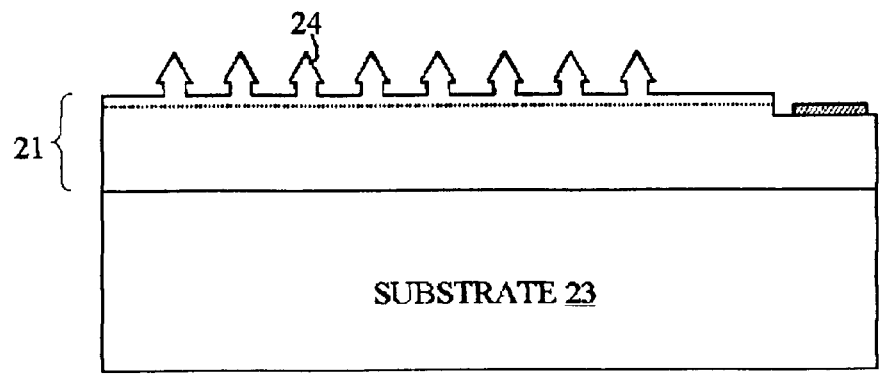
Figure 6:
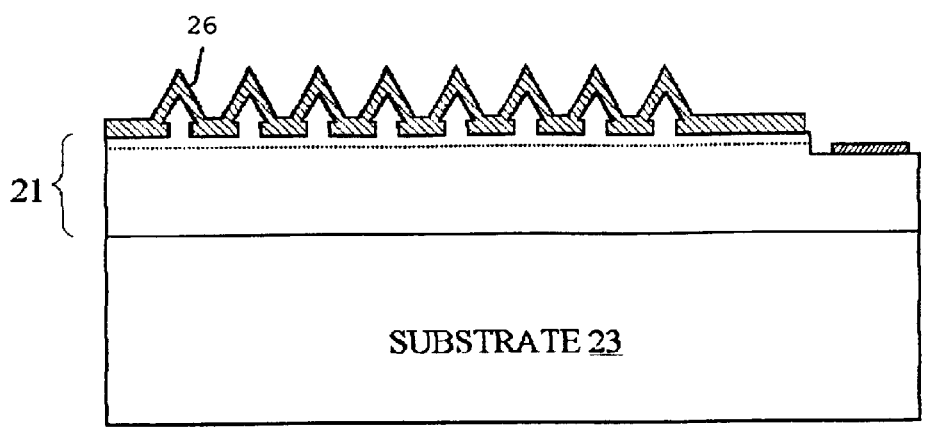

One method for providing disruptions in the upper GaN layer utilizes a particular property of GaN grown on patterned $SiO_2$ to create features on top of the upper surface of GaN layer. These features have facets at angles that allow light travelling at a shallow angle with respect to the top surface of the LED to exit the top surface or at least be scattered out of the waveguide. Refer now to FIGS. 3–6, which are cross-sectional views of an LED 20 at various stages in the fabrication process. Referring to FIG. 3, a GaN p-n junction layer 21 is deposited on a substrate 23 as described above. A $SiO_2$ mask 22 having a large number of holes is deposited on the GaN surface using conventional lithography techniques. The width of the holes is exaggerated in relation to the width of the mask between adjacent holes to enable the holes to be depicted in the drawings. Referring to FIG. 4, GaN is then epitaxially grown over the mask. Since GaN will not nucleate on $SiO_2$, the GaN grows only in the holes until the GaN layer reaches the top of the holes. At this point, the GaN will grow both upward and laterally, nucleated by the material in the hole. The shape of the extension of the GaN layer on top of the mask will be pyramidal. If the GaN is allowed to grow for a sufficient period of time, a pyramid will form over each hole as shown at 24. If the growth is stopped prior to this point, the pyramid will be truncated. Once the pyramid has reached the desired height, the growth is terminated and the $SiO_2$ mask removed by conventional etching techniques. This leaves LED with the surface shown in FIG. 5. Finally, the transparent top electrode 26 may be deposited over the pyramids as shown in FIG. 6.

LEDs fabricated in this manner have approximately twice the light output of prior art LEDs running at the same power. The output gain is even higher in devices that utilize a reflective top electrode and extract the light through the substrate.

Since the pyramids are grown with the same doping as the top layer of the GaN, the entire area of the p-n junction will receive current. Hence, the loss of efficiency that characterizes the etching of the top surface is eliminated by this approach. In addition, the facets of the pyramids couple more light out of the device than systems based on random etching. Further, the pyramids do not disrupt the p-n junction, and hence, no loss in light generation efficiency results from this method of disrupting the top surface.

The third method for disrupting the waveguide is to insert vertical light pipes into the waveguide. Light entering these light pipes is piped to the surface where it escapes. In addition, part of the light that does not enter the light pipes because it is scattered from the outer surface is also redirected such that it can now escape the device. In one embodiment of the present invention, the light pipes are generated by etching vertical holes into the GaN layer and then filling the holes with a material having an index of refraction which is less than that of GaN.

Figure 7:
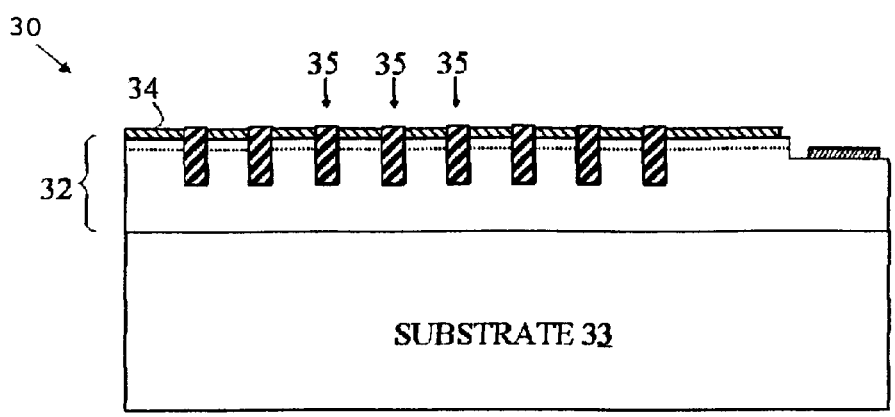
FIG. 7 is cross-sectional view of an LED according to the present invention that utilizes "light pipes" to improve the coupling efficiency.

Refer now to FIG. 7, which is cross-sectional view of an LED 30 utilizing light pipes to improve the coupling efficiency. A GaN p-n junction layer 32 is deposited on a substrate 33 as described above and a top electrode 34 is then deposited over layer 32. A hole pattern 35 is then etched through the top electrode and into the GaN layer 32. The hole pattern is etched using conventional lithographic procedures. The depth of the holes is chosen to intercept light that is trapped in the waveguide created by the top surface of the GaN layer and the sapphire substrate 33. It should be noted that the intensity of light between these two surfaces has a maximum at a point approximately midway between the surfaces. In the preferred embodiment of the present invention, the holes extend at least to this depth to capture light in this part of the waveguide. The holes are then filled with a material having an index of refraction less that of the GaN. In the preferred embodiment of the present invention, the holes are filled with $SiO_2$. The optimum material would have an index of refraction, n, given by $$n = \sqrt{\sqrt{n_{GaN} n_a}}$$

where, $N_{GaN}$ is the index of refraction of GaN and $n_a$ is the index of refraction of the medium over the transparent electrode. The medium is usually air or epoxy. However, embodiments in which the holes are filled with other materials or air can also be practiced without departing from the teachings of the present invention. LEDs utilizing light pipes as described above are found to have 70–80% more light output than similar devices without light pipes.

It should be noted that the above described light pipes are not limited to cylindrical holes extending into the device. For example, the light pipes may be trenches etched in the GaN layer. Furthermore, the sides of the light pipes need not be perpendicular to the surface of the GaN layer.

The above discussion has focused on GaN based LEDs. However, it will be obvious to those skilled in the art from the preceding discussion that the methods of disrupting the waveguide discussed above are also applicable to LEDs constructed from other materials provided the roughening does not interfere with the growth of the p-n diode.

A fourth method for providing the roughened surface is based on the observation that GaN grown at low temperatures or under conditions in which the ratio of V/III material is low naturally has a rough surface. Under these conditions, GaN layers naturally facet so that hexagonal shaped pits form along the surface. This natural faceting can be used as a scattering surface when the pits are approximately 0.1 microns or larger in size. In this embodiment of the present invention, the growth temperature of the GaN is lowered during the deposition of the last portion of the GaN layer to provide a roughened layer. It can be shown that growth temperatures below 1040° C. promote pitting. Alternatively, the molar flow ratio of ammonia to trimethygallium can be reduced to below 10000 during the growth of the layer. Since this effect is known to those skilled in the art, it will not be discussed in more detail here. Readers who are not familiar with this effect are directed to the paper by D. Kapolnek, et al., Appl. Phys. Lett. 71, (9), Sep. 1, 1997 for more details.

As noted above, light can be extracted from the LED either through the top surface by utilizing a transparent electrode or through the substrate. The fourth embodiment discussed above is well suited to the latter of these alternatives in that the conventional processes need only be altered to provide growth conditions that result in pitting during final phases of growing the top GaN layer. A reflective electrode is then deposited over the pits. The electrode material then fills the pits providing reflecting protrusions that scatter the light striking the electrode-GaN layer interface.

While the above description has referred to GaN-based LEDs, it is to be understood that GaN based LEDs include any LED based on compounds of the form $Al_xGa_yIn_zN$, where x+y+z=1. It is also to be understood that Al or In may be absent from p-type or n-type layers of the LED.

Various modifications to the present invention will become apparent to those skilled in the art from the foregoing description and accompanying drawings. Accordingly, the present invention is to be limited solely by the scope of the following claims.

What is claimed is:

1. An LED comprising:

a substrate having a top surface;

a first layer of a semiconducting material deposited on said substrate;

a second layer of said semiconducting material, said first and second layers forming a p-n diode;

a light generation region between said first and second layers for generating light when a potential is applied across said first and second layers;

a first contact comprising a conducting layer deposited on said second layer; and a second contact connected electrically to said first layer, wherein one of said top surface of said substrate and said surface of said second layer that is not in contact with said first layer includes protrusions and/or depressions for scattering light.

2. The LED of claim 1 wherein said substrate is transparent and wherein said first contact reflects light back toward said substrate.

3. The LED of claim 1 wherein said substrate is sapphire.

4. The LED of claim 1 wherein said semiconducting material comprises GaN.

5. An LED comprising:

a substrate having a top surface;

a first layer of a semiconducting material deposited on said substrate;

a second layer of said semiconducting material, said first and second layers forming a p-n diode;

a light generation region between said first and second layers for generating light when a potential is applied across said first and second layers;

a first contact comprising a conducting layer deposited on said second layer;

a second contact connected electrically to said first layer; and a plurality of channels extending from the surface of said second layer that is not in contact with said light generation region, said channels being filled with a material having an index of refraction less that that of said semiconducting material said channels intercepting light generated in said light generation region directing said light out of said LED.

6. The LED of claim 5 wherein said channels extend into said first layer.

7. The LED of claim 5 wherein said channels are filled with $SiO_2$.

8. The LED of claim 5 wherein said channels are filled with a gas.

* * * * *